US 7,519,484 B2

(12) United States Patent
Colman et al.

(10) Patent No.: US 7,519,484 B2
(45) Date of Patent: Apr. 14, 2009

(54) POWER SUPPLY MONITOR

(75) Inventors: Derek Colman, Bedford (GB); Andrew Joy, Northampton (GB); Tom Leslie, Northampton (GB)

(73) Assignee: Texas Instruments Incorporated, Dallas, TX (US)

( * ) Notice: Subject to any disclaimer, the term of this patent is extended or adjusted under 35 U.S.C. 154(b) by 594 days.

(21) Appl. No.: 11/151,555

(22) Filed: Jun. 13, 2005

(65) Prior Publication Data

US 2006/0036379 A1    Feb. 16, 2006

(30) Foreign Application Priority Data

Jun. 12, 2004    (GB)    ................... 0413145.4

(51) Int. Cl.
*G01R 21/06*    (2006.01)
*G01R 21/00*    (2006.01)
(52) U.S. Cl. ................. 702/60; 702/64; 702/189; 324/714; 324/723; 714/22; 315/291; 700/90; 700/286; 700/297
(58) Field of Classification Search ............ 702/60, 702/64, 189; 324/714, 723, 713, 712; 714/22; 315/291; 700/90, 286, 297
See application file for complete search history.

(56) References Cited

U.S. PATENT DOCUMENTS 5,146,397 A * 9/1992 Fruhling ............... 363/74
5,610,709 A * 3/1997 Arrington et al. ........... 356/218
6,628,135 B2   9/2003 Gauthier et al.
6,747,470 B2   6/2004 Muhtaroglu et al.
6,979,987 B2 * 12/2005 Kernahan et al. ........... 323/283

FOREIGN PATENT DOCUMENTS

GB    2 083 306 A    3/1982
GB    2 395 020 A    5/2004

OTHER PUBLICATIONS

Aguirre et al., 'Voltage Monitoring Insturment with Fast Transients Capture Capability', 2003, JOART Publicaiton, pp. 194-202.*
Circuits and Techniques for High-Resolution Measurement of On-Chip Power Supply Noise, Elad Alon, Vladimir Stojanovic, and Mark Horowitz, Department of Electrcal Engineering, Stanford University, CA 94305, US, Rambus, Inc. Los Altos, CA 94022, USA.

* cited by examiner

*Primary Examiner*—Edward Raymond
*Assistant Examiner*—Elias Desta
(74) *Attorney, Agent, or Firm*—William B. Kempler; W. James Brady; Frederick J. Telecky, Jr.

(57) ABSTRACT

There is provided a power supply monitor circuit comprising a positive supply monitoring input, a negative supply monitoring input, and a voltage divider connected between the positive and negative supply monitoring inputs and having an intermediate node providing a potential intermediate those on the positive and negative supply monitoring inputs. A sampling circuit is connected to sample the potential at each of the positive supply input the negative supply input and the intermediate node. Also provided is a method of monitoring noise on a power supply whereby phase information from those samples is derived about the noise signals at the two said points.

17 Claims, 1 Drawing Sheet

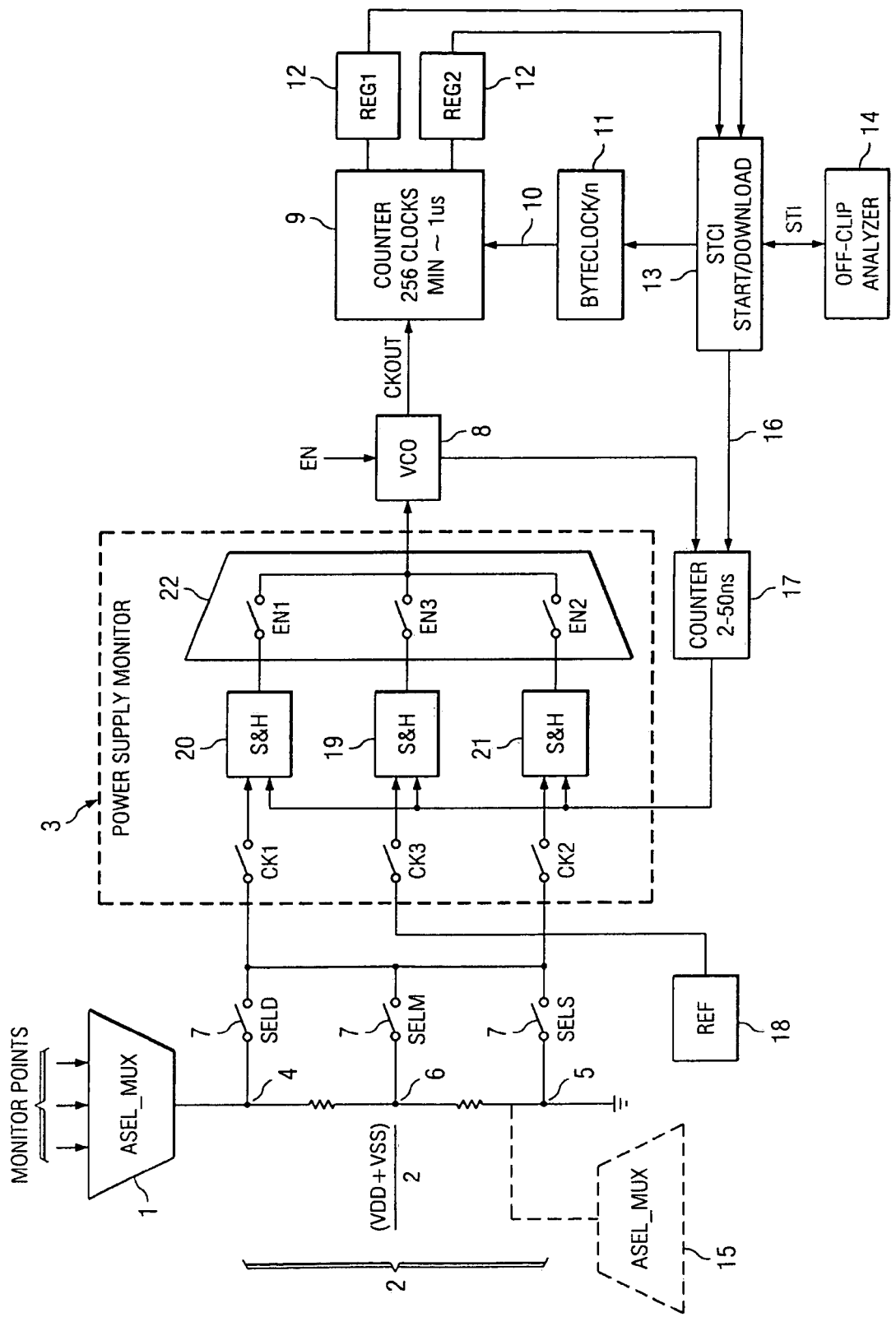

POWER SUPPLY MONITOR

BACKGROUND OF THE INVENTION

This invention provides a power supply monitor and is intended to be capable of assessing the noise on a supply line both with respect to amplitude and frequency content. The circuit is based on a published paper, (Elad Alon et al. VLSI Symposium, 2004) but includes a number of enhancements.

SUMMARY OF THE INVENTION

The present invention provides a power supply monitor circuit as defined in the appended claims.

BRIEF DESCRIPTION OF THE DRAWINGS

An example of the present invention will now be described with reference to the accompanying drawings, of which:

FIG. 1 is a block diagram of a power supply monitor circuit according to the present invention.

DETAILED DESCRIPTION

In the circuit of FIG. 1, a particular point on the positive supply within the circuit to be monitored is selected using a multiplexer I (ASEL_MUX) and this potential is applied to a potential divider 2. A sample & hold function 3 stores the value at one of three sample points for a specific moment in time. The three points that can be sampled are the selected positive supply point VDD 4, a negative supply sample point VSS 5, and the mid point 6 of the voltage divider 2. Preferably the voltage divider provides at the mid point (VDD+VSS)/2, but other ratios are possible. The point sampled is selected by switches 7. In the example of FIG. 1 only one negative supply sample point is shown.

The voltage stored by the sample and hold function 3 is applied to a voltage controlled oscillator VCO 8, which, of course, by definition, causes the VCO frequency to be modified. The frequency of the VCO 8 is evaluated using a counter 9 for a fixed period of time. Conveniently the period is fixed with respect to the (or a) clock used to clock the circuit that is being monitored, but any other signal providing an interval of time would do. In the example of FIG. 1 a low speed clock 10 is shown provided by a divider 11 which divides a "byte clock", which provides a suitable length interval. (Clocks are termed "byte clock" when data is converted from serial to parallel streams e.g. by a shift register and the "byte clock" is the clock used to clock the parallel bytes output by the shift register, whereas the "bit clock" is the clock used to clock the serial data stream.) Registers 12 are provided to receive the count from the counter 12. Control of the circuit of FIG. 1 is provided by a control circuit STCI 13, which inter alia controls the counter 9 to measure the frequency of the VCO 8 and scans the recorded counts in the registers 12 out to an external analyzer computer 14. The analyzer computer 14 may also command the monitoring circuit 14 to perform its monitoring functions.

After calibration, the output of the counter 9 can be related to the sampled voltage. The calibration process is described later below. Note that the sample and hold function 3 and the VCO, of course, have a signal ground against which the level of the potential they measure is judged. In general this ground is not the same ground as the VSS 5, which of course is measured by the circuit.

Advantageously the monitor circuit of FIG. 1 is provided as part of the integrated circuit that is to be monitored. This reduces the impedance of the lines connecting the point sampled to the sample and hold function 3. The sample and hold function 3 when sampling charges a capacitance, so therefore siting the monitor circuit in the integrated circuit reduces the RC time constant and preserves high frequencies in the signals from the monitored points so that they can be measured.

By taking repeated samples at uncorrelated moments in time, a picture of the amplitude variation of the supply can be built up. Since the waveform of the potential of the point sampled is sampled at random points in time eventually the samples taken will cover all the range of the values taken by the waveform. This therefore gives a measure of the amplitude of that waveform.

The technique permits the evaluation of both the VDD and the VSS at a specific point within a chip. Evaluation of these two points provides amplitude information of each point individually, but without phase information, the relative amplitude (VDD-VSS) is not available. The purpose of the potential divider is to provide the necessary phase information by measuring the mid point (VDD+VSS)/2. If VDD and VSS are in anti-phase then the noise at the mid point will be zero. (Strictly of course the noise at the midpoint will be zero if the VDD and VSS are in antiphase and have the same amplitude. If they are in antiphase and have different amplitudes then (for a single frequency) the amplitude of the noise at the mid point will be half the difference of the amplitudes of VSS and VDD.) If they move in phase then the noise at the mid point will not be attenuated.

Frequency information about the noise is obtained using an auto-correlation technique. Two samples are taken from the same point in the circuit but shifted in time by a controlled amount. Frequencies of interest are evaluated with a time shift controllable from 2 to 50 ns (with different shifts of course providing information about different frequencies in the noise. The sampling moment must be uncorrelated with any noise generating clocks on chip and is therefore initiated by a clock 16 from the control circuit STCI. A counter 17 working from the VCO 8 generates the time shift. The VCO 8 is free running with a reference voltage input. (The reference voltage is may be provided by a reference voltage circuit 18 provided within the chip or may, for extra accuracy be provided from a source external to the chip. For symmetry with the sampling of VDD etc (see below) the reference voltage is first sampled by a sample and hold circuit 19 within the sample and hold function 3 before being passed to the input of the VCO 8.) Under the control of the reference voltage the VCO 8 produces a time interval that is not accurately controlled but can be calibrated.

In order to take the two samples from the particular point on the power supply, two sample and hold circuits 20 and 21 are provided in the sample and hold function 3. The sampling by one is initiated at the beginning of the count provided by counter 17 and the other at the end.

A multiplexer 22 is used to select which one of the sample and hold circuits provides its sampled voltage level to the VCO 8. During the sampling of the power supply the VCO input remains connected to the reference voltage so that counter 17 runs at the desired rate and sets the interval between the two samples of the particular point on the power supply. Once the sampling is complete, one of the sample and hold circuits 20 and 21 is connected to the VCO input and its resultant frequency is counted by counter 9 thereby measuring the voltage on that sample and hold circuit. Next the other one of the sample and hold circuits 20 and 21 is connected to the VCO input and its voltage is similarly measured.

Note again that the measurement (i.e. the pair of samples) is repeated at random intervals so that the amplitude can be determined. (Consider for example sampling a frequency at two point separated by half the period of that frequency; depending on where the samples fall the difference between them can range from the peak to peak amplitude to zero.)

In comparison to the present invention the Alon reference describes a technique for measuring VDD only, and has a restricted voltage range. This circuit covers a wide range of voltages from below VSS to above VDD, and the voltage is applied to a varactor that handles the wide input range. The wide range obviates the use of a buffer on the sample and hold capacitor so charge sharing techniques replace the buffer. Because the charge is shared between the sample and hold capacitor and the varactor, it is necessary to put the varactor in a known state prior to the charge share. This is done by opening the VCO loop to stop the oscillation and grounding one side of the varactor.

A practical difficulty with this invention relates to the RC time constant resulting from the sample & hold capacitor and the source impedance. The result is a frequency dependent attenuation that is different for each of the 3 monitor points. Furthermore, when both S&H capacitors are connected to the monitor point, the attenuation is one value. After the first sample is taken and only one S&H capacitor is connected, the attenuation adjusts to a new value. A novel technique to avoid having two attenuation values is now described.

A single attenuation value is achieved by having only one capacitor connected at a time. For the simple case and the example circuit of FIG. 1, this would give the second sample a worst case of only 2 ns to charge from an unknown value and settle. This is not enough time with practicable impedance and capacitance values. The solution is to cycle several times with the 2 capacitors (i.e. sample and hold circuits 20 and 21) being alternately connected for the required period, say 2 ns. As a result, each capacitor is precharged to a voltage close to the final value before the final sample and hold period and time constant errors are reduced. This means that the sample and hold value contains some information from previous periods but this is beneficial as the frequency that is being analyzed will be reinforced and other frequencies will be attenuated. Only following the final period of charging are the two samples passed to the VCO 8 for their levels to be measured.

Again the measurement is repeated at random to ensure that something approaching the amplitude of frequency is measured at one of the repetitions.

Note that in the example circuit of FIG. 1 the selected VDD point is measured with respect to the one particular VSS point 5. If measurements of VDD with a different VSS point than VSS point 5 are required then this different VSS point can be connected with the multiplexer 1 which is then measured with respect to the VSS point 5. This information together with measurements of VDD with respect to the VSS point 5 a can be then used to construct in the analyzer computer measurements of the VDD with respect to the said different VSS point. Alternatively the circuit could be arranged to select from one of multiple point on the negative supply; as indicated in dotted lines a multiplexer 15 can be provided to allow that.

Sequence of Operation

Signals

| | |
|---|---|
| PD | Power down |
| EN | Enable the VCO to run |
| EN1 | Connects S&H capacitor 20 to the varactor. i.e. the VCO 8 |
| EN2 | Connects S&H capacitor 21 to the varactor. i.e. the VCO 8 |
| EN3 | Connects S&H capacitor 19 to the varactor. i.e. the VCO 8 |
| CK1 | Connects S&H capacitor 20 to the input (i.e. the selected one of VDD, VSS and their mid point) |

-continued

| | |
|---|---|
| CK2 | Connects S&H capacitor 21 to the input (i.e. the selected one of VDD, VSS and their mid point) |
| CK3 | Connects S&H capacitor 19 to the reference. |
| CKOUT | VCO 8 output frequency |

Initialization.

Referring to FIG. 1 the circuit is initialized by setting the following signals:

EN=lo, EN1=lo, EN2=lo, CK2=lo, CK1=hi.

Calibration.

To calibrate, first connect the input via the ASEL_MUX to an external voltage. Apply a range of voltages to the input for calibration.

Keep CK1 hi for a period long enough to charge the sample & hold capacitor. Sampling on S&H1 occurs when CK1 goes lo.

Evaluate the sample as follows. Simultaneously make EN1=hi, EN=hi. Count the clocks at CKOUT for approx. 1us using the divided byte clock or other slow clock. Shift out the count.

Create table of input voltages vs clock count.

Repeat with CK2 to calibrate S&H2.

Taking a Reading.

Set EN3=hi to connect the reference voltage to the VCO and cause it to generate a clock with a frequency not correlated with any other clock on chip. Then alternately set CK2=hi, CK1=hi, to connect S&H1, S&H2 to net to be measured.

Connect REF to a reference voltage. Keep CK3 hi for >10 ns. Then set CK3=lo. EN3=hi, EN=hi. Evaluate CKOUT frequency. Use CKOUT divided down to generate alternating CK1 and CK2 with an adjustable period from 2 ns to 50 ns and a minimum of 5 cycles.

Stop the VCO by setting EN=lo. Wait>10 ns.

Evaluate the voltage stored on sample & hold1 by setting EN1=hi, EN=hi, count CKOUT for 1 us. Put count into register. Now reset by applying EN1=lo, EN=lo for >10 ns.

Evaluate sample & hold2 in a similar way. Set EN2=hi, EN=hi, count CKOUT for 1us.

Reset by applying EN2=lo, EN=lo for >10 ns.

Shift and tabulate CKOUT counts.

Repeat for a range of CK2-CK1 time shifts to reconstruct the spectral density.

Repeat the procedure for VDD, VSS & (VDD+VSS)/2 to get differential and phase information.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A power supply monitor circuit comprising:
   a positive supply monitoring input,
   a negative supply monitoring input,
   a voltage divider connected between the positive and negative supply monitoring inputs and having an intermediate node providing a potential intermediate those on the positive and negative supply monitoring inputs,
   a sampling circuit connected to sample the potential at each of the positive supply input the negative supply input and the intermediate node, wherein the sampling circuit is arranged to sample a particular potential twice separated by a particular interval of time and wherein the sampling circuit comprises two sample and hold circuits respectively connected to obtain respectively one of the two said samples of the potential.

2. A power supply monitor circuit according to claim 1 comprising:
   a measuring circuit connected to receive the samples from the sampling circuit of the potential at each of the positive supply input the negative supply input and the intermediate node and to provide respective measurements of those samples.

3. A power supply monitoring circuit according to claim 2 wherein the measuring circuit comprises
   a voltage controlled oscillator connected to receive a sampled potential from the sampling circuit and to output a signal having a frequency dependent on that potential, and
   a measuring counter connected to count at a rate dependent on that frequency.

4. A power supply monitoring circuit according to claim 1 comprising a sampling interval counter is connected to control the said particular interval between the two samples.

5. A power supply monitoring circuit according to claim 4 wherein the sampling interval counter is connected to count at a rate dependent on the frequency of the output of the or a voltage controlled oscillator.

6. A power supply monitoring circuit according to claim 5 wherein the said voltage controlled oscillator is connected to receive a reference voltage when connected to control the sampling interval counter.

7. A power supply monitoring circuit according to claim 1 wherein the circuit is arranged to connect each of the two sample and hold circuits alternately, each a plurality of times separated by a particular interval, that interval being the same for each of the two sample and hold circuits.

8. A power supply monitoring circuit according to claim 1 wherein the voltage divider comprises two equal resistances each connected between the said intermediate point and respective ends of the voltage divider.

9. A power supply monitoring circuit according to claim 1 and a monitored circuit,
   wherein the monitored circuit comprises a first supply conductor, for supplying the monitored circuit, having a monitoring point connected to the positive supply monitoring input of the monitoring circuit, and
   wherein the monitored circuit comprises a second supply conductor, for supplying the monitored circuit, having a monitoring point connected to the negative supply monitoring input of the monitoring circuit.

10. A power supply monitoring circuit and monitored circuit, according to claim 9 wherein the monitoring circuit comprises a multiplexer connected to receive the potential at a plurality of points on the said first or second supply conductors and to supply a selected one of those to either the positive or negative supply monitoring inputs.

11. An integrated circuit comprising the power supply monitoring circuit and the monitored circuit according to claim 9.

12. A method of monitoring noise on a power supply comprising
   providing a voltage divider having an output intermediate in voltage between that applied to the ends,
   connecting the ends of the voltage divider to respective points on a or different supply conductors of a circuit to be monitored,
   sampling the potential at each of the ends of the voltage divider and at the intermediate output of the voltage divider,
   deriving phase information from those samples about the noise signals at the two said points,
   providing two sample and hold circuits and sampling a particular said potential alternately with each of the sample and hold circuits a plurality of times separated by a particular constant interval, the particular interval being the same for each of the two sample and hold circuits.

13. A power supply monitoring circuit according to claim 2 wherein the sampling circuit is arranged to sample a particular potential twice separated by a particular interval of time.

14. A power supply monitoring circuit according to claim 3 wherein the sampling circuit is arranged to sample a particular potential twice separated by a particular interval of time.

15. A power supply monitoring circuit according to claim 4 wherein the sampling circuit comprises two sample and hold circuits respectively connected to obtain respectively one of the two said samples of the potential.

16. A power supply monitoring circuit according to claim 5 wherein the sampling circuit comprises two sample and hold circuits respectively connected to obtain respectively one of the two said samples of the potential.

17. A power supply monitoring circuit according to claim 6 wherein the sampling circuit comprises two sample and hold circuits respectively connected to obtain respectively one of the two said samples of the potential.

* * * * *